(12) United States Patent
Bonin et al.

(10) Patent No.: US 6,387,778 B1
(45) Date of Patent: May 14, 2002

(54) BREAKABLE TETHERS FOR MICROELECTROMECHANICAL SYSTEM DEVICES UTILIZING REACTIVE ION ETCHING LAG

(75) Inventors: Wayne A. Bonin, North Oaks; Zine-Eddine Boutaghou, Vadnais Heights; Roger L. Hipwell, Jr.; Barry D. Wissman, both of Eden Prairie; Lee Walter, Plymouth; Barbara J. Ihlow-Mahrer, Crystal, all of MN (US)

(73) Assignee: Seagate Technology LLC, Scotts Valley, CA (US)

( * ) Notice: Subject to any disclaimer, the term of this patent is extended or adjusted under 35 U.S.C. 154(b) by 40 days.

(21) Appl. No.: 09/649,536

(22) Filed: Aug. 28, 2000

Related U.S. Application Data (60) Provisional application No. 60/181,912, filed on Feb. 11, 2000.

(51) Int. Cl.[7] .................. H01L 21/301; H01L 21/78
(52) U.S. Cl. .......................................... 438/462; 216/2
(58) Field of Search ................... 438/113, 460, 438/462, 464; 216/2

(56) References Cited

U.S. PATENT DOCUMENTS

| | | |
|---|---|---|
| 5,389,182 A | 2/1995 | Mignardi |
| 5,605,489 A | 2/1997 | Gale et al. |
| 5,710,065 A | 1/1998 | Alfaro |
| 5,904,546 A * | 5/1999 | Wood et al. ................. 438/460 |
| 5,923,995 A | 7/1999 | Kao et al. |
| 5,972,781 A * | 10/1999 | Wegleiter et al. ............ 438/460 |
| 5,998,234 A * | 12/1999 | Murata et al. ................. 438/53 |
| 6,075,280 A * | 6/2000 | Yung et al. .................. 257/620 |

OTHER PUBLICATIONS

Shaw et al., "SCREAM 1: A Single Mask, Single–Cyrystal Silicon Process for Microelectromechanical Structures", 1993, Preceedings of the 1993 IEEE Micro Electro Mechanical Systems (MEMS '93), pp. 155–160.*

* cited by examiner

*Primary Examiner*—Michael J. Sherry
*Assistant Examiner*—Evan Pert
(74) *Attorney, Agent, or Firm*—Kinney & Lange P.A.

(57) ABSTRACT

Utilizing reactive ion etching (RIE) lag, tethers are fabricated that reliably hold devices in place during processing and storage, yet are easily broken to remove the parts from the wafer as desired, without requiring excessive force that could damage the devices. The tethers are fabricated by slightly narrowing the periphery etch feature at several places. By adjusting the ratio of the main periphery width to the necked width at the tethers, the final thickness of the tether can be controlled to a small fraction of the wafer thickness, so that tethers defined by readily achievable feature sizes will reliably hold the parts in place until removal is desired. Since the tethers are now only a fraction of the wafer thickness, they will reliably break to release the part at a force level that will not damage the part.

6 Claims, 8 Drawing Sheets

BREAKABLE TETHERS FOR MICROELECTROMECHANICAL SYSTEM DEVICES UTILIZING REACTIVE ION ETCHING LAG

CROSS-REFERENCE TO RELATED APPLICATION(S)

This application claims priority from Provisional Application No. 60/181,912 filed Feb. 11, 2000, for "Breakable Tethers for MEMS Devices Utilizing RIE Lag" by W. Bonin, Z. Boutaghou, R. Hipwell, B. Wissman, L. Walter, and B. Ihlow-Mahrer.

BACKGROUND OF THE INVENTION

The present invention relates to a disc drive microactuator, and more particularly to a method of singulation of microactuator devices from a silicon wafer.

The density of concentric data tracks on magnetic discs continues to increase (that is, the size of data tracks and radial spacing between data tracks continues to decrease), requiring more precise radial positioning of the head. Conventionally, head-positioning is accomplished by operating an actuator arm with a large-scale actuation motor, such as a voice coil motor, to radially position a head on a flexure at the end of the actuator arm. The large-scale motor lacks sufficient resolution to effectively accommodate high track-density discs. Thus, a high resolution head positioning mechanism, or microactuator, is necessary to accommodate the more densely spaced tracks.

One promising approach for high resolution head positioning involves employing a high resolution microactuator in addition to the conventional lower resolution actuator motor, thereby effecting head positioning through dual-stage actuation. Various microactuator designs have been considered to accomplish high resolution head positioning. One design involves inserting a silicon-based thin film structure between the suspension and the slider in a disc drive assembly. Such a design must be realized in a relatively small wafer area, to keep costs reasonable and to allow easy integration into the disc drive design.

After fabrication of the structure is completed, the final process step for nearly all microelectromechanical systems (MEMS), including the microactuator design discussed herein, is singulation of the devices from the wafer. Due to the cost efficiency of wafer processing versus individual device processing, it is desirable to keep the devices in wafer form for as many process steps as possible.

Dicing with saw blades is the most common method of singulation, but requires that the device features be protected from the water and debris generated by the sawing. Device singulation can be done by the final structure etch for devices that are etched through the wafer. Small tabs of silicon can be left unetched to hold the devices in place for fabrication of features of the device, but it is very difficult to control the dimensions of the tab so that it will reliably hold the devices in place, yet break off easily when desired without damaging the device. This is because the tabs for devices that are 200 micrometers ($\mu$m) thick would have to be approximately 1 $\mu$m wide to break reliably under a vertical load, as would be applied by automated equipment. Tabs this narrow cannot be produced in a controllable manner, and would be susceptible to accidental breakage from unintentional forces applied in the plane of the wafer.

BRIEF SUMMARY OF THE INVENTION

The present invention is a method for singulation of MEMS devices from a substrate wafer. Singulation is performed by first masking the substrate wafer to define a channel around a periphery of each of the MEMS devices on the substrate wafer. The channel has a first width along a first portion of the channel and a second width less than the first width along a second portion of the channel. The substrate wafer is then etched using a reactive ion etching (RIE) process, thus separating the MEMS devices from the substrate wafer along the first portion of the channel and forming breakable tethers that connect the MEMS devices to the substrate wafer along the second portion of the channel.

BRIEF DESCRIPTION OF THE DRAWINGS

FIG. 5b is a diagram showing a portion of the substrate wafer of

FIG. 5a in an enlarged detailed perspective.

FIG. 6a is a top-lit top view and

FIG. 7a is a top-lit top view and

FIG. 8a is a diagram of a typical microactuator substrate wafer.

FIG. 8b is a diagram showing a portion of the substrate wafer of

FIG. 8a after separating each device according to the present method, showing tethers fabricated at the bottom of the wafer in an enlarged detailed perspective.

DETAILED DESCRIPTION

Figure 1:
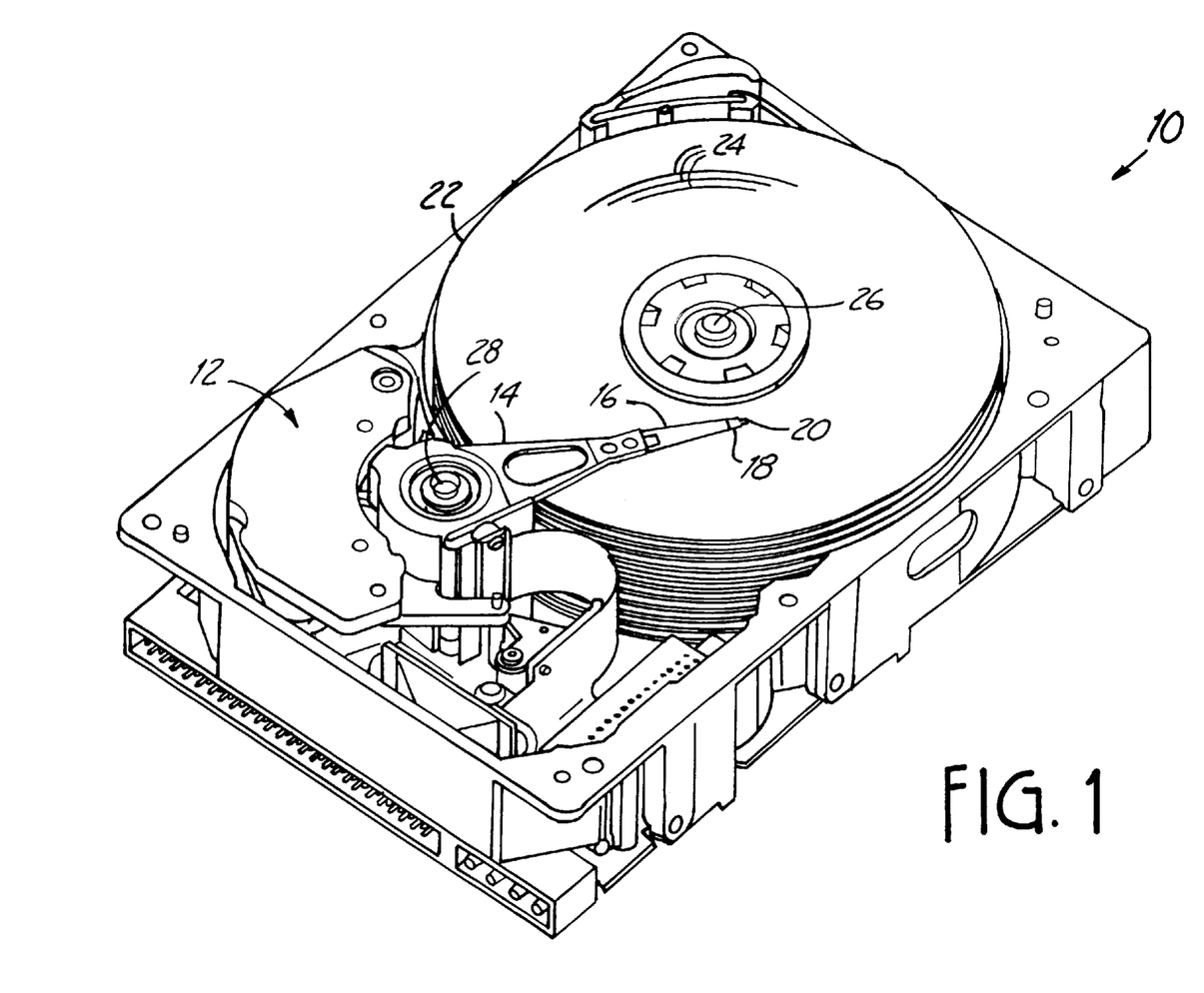
FIG. 1 is a perspective view of a disc drive actuation system for positioning a slider over tracks of a disc.

FIG. 1 shows a perspective view of disc drive system 10 for positioning a transducing head (not shown) over a selected track of a magnetic disc. The system 10 includes, as shown generally from left to right in FIG. 1, voice coil motor (VCM) 12, actuator arm 14, suspension 16, flexure 18, and slider 20. Slider is connected to the distal end of suspension 16 by flexure 18. Suspension 16 is connected to actuator arm 14 which is coupled to VCM 12. As shown on the right side of FIG. 1, disc drive system 10 includes disc 22 having a multiplicity of tracks 24 that rotate about axis 26. During operation of disc drive system 10, the rotation of disc 22 generates air movement which is encountered by slider 20. This air movement or windage acts to keep slider 20 aloft a small distance above the surface of disc 22, allowing the slider to "fly" above the surface of disc 22.

VCM 12 is selectively operated to move actuator arm 14 around axis 28, thereby moving suspension 16 and positioning the transducing head (not shown) carried by slider 20 between tracks 24 of disc 22. Proper positioning of the transducing head (not shown) is necessary for reading and writing of data on concentric tracks 24 of disc 22. For a disc having a high track density, however, VCM 12 lacks sufficient resolution and frequency response to accurately position the transducing head (not shown) carried by slider 20 over a selected track 24 of disc 22. Therefore, a higher resolution actuation device is used in combination with VCM 12.

Figure 2:
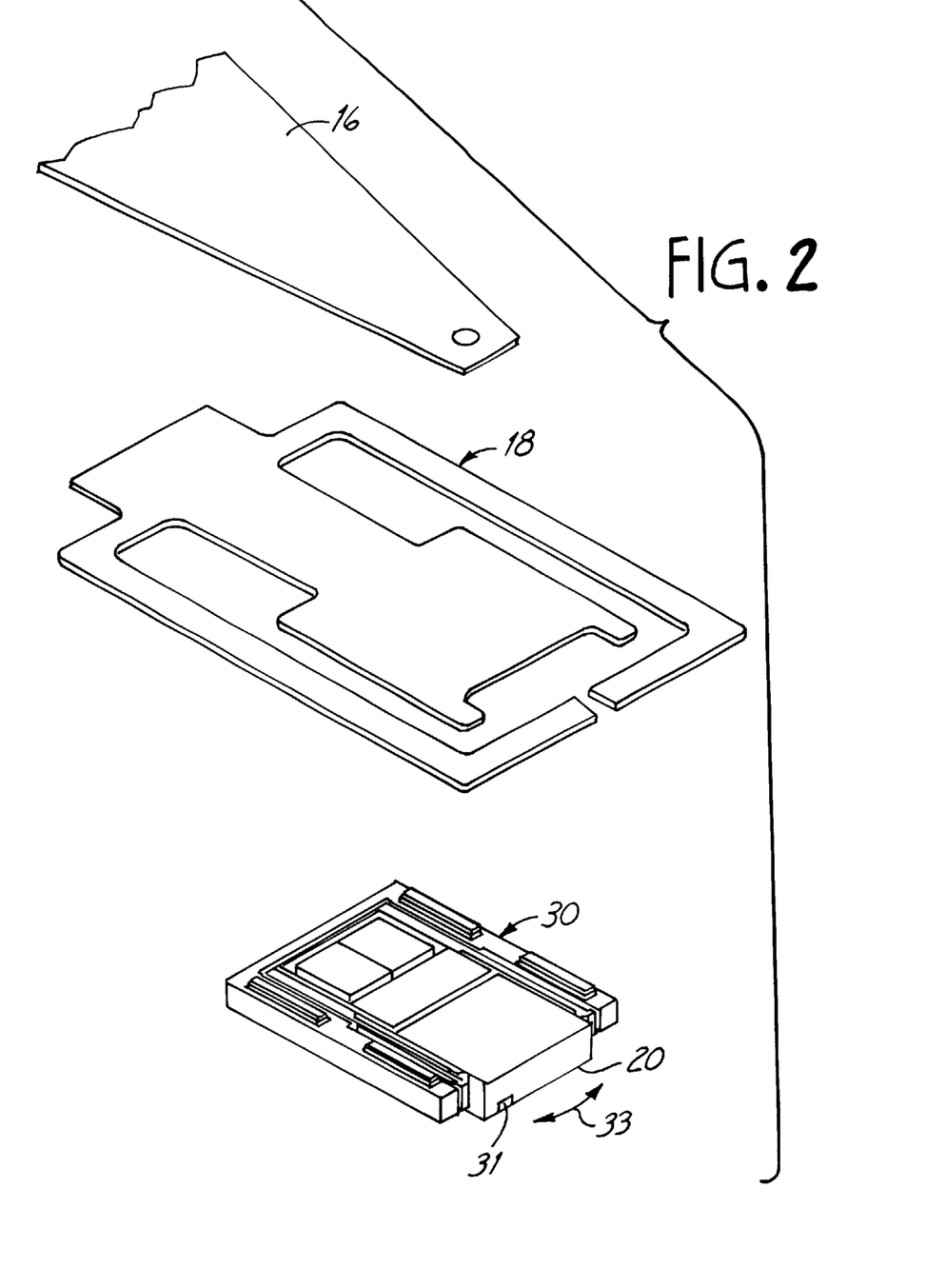
FIG. 2 is an exploded perspective view of a portion of a disc drive including a microactuator.

FIG. 2 is an exploded perspective view of a portion of a disc drive including microactuator 30. Flexure 18 is attached to load beam 16, and microactuator 30 is attached to flexure 18 to carry slider 20 above a surface of disc 22 (FIG. 1). Transducing head 31 is carried by slider 20 to transduce data with the disc.

In operation of the disc drive, load beam 16, flexure 18 and microactuator 30 carrying slider 20 are all moved together as coarse positioning is performed by VCM 12 (FIG. 1) moving actuator arm 14 (FIG. 1). To achieve fine positioning of transducing head 31, microactuator 30 generates a force which causes bending of the beam springs of the microactuator. As a result, the portion of microactuator 30 carrying slider 20 moves slightly with respect to flexure 18 in the direction of arrows 33, displacing transducing head 31 with high resolution for precise positioning over a selected track of the disc.

Figure 3:
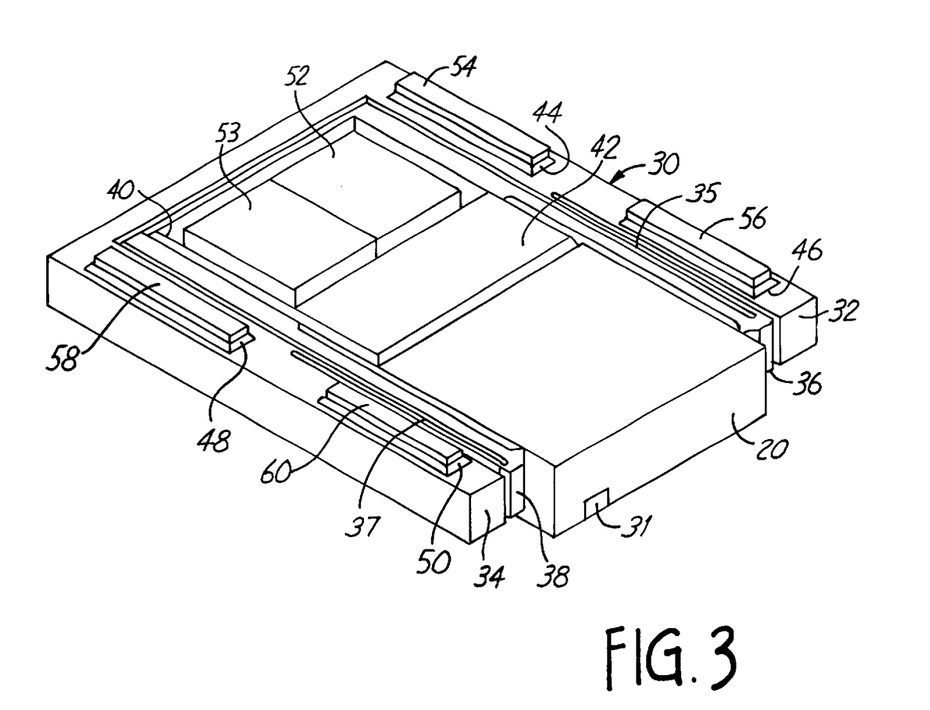
FIG. 3 is a perspective view of a microactuator system for positioning a slider over tracks of a disc.
Figure 4:
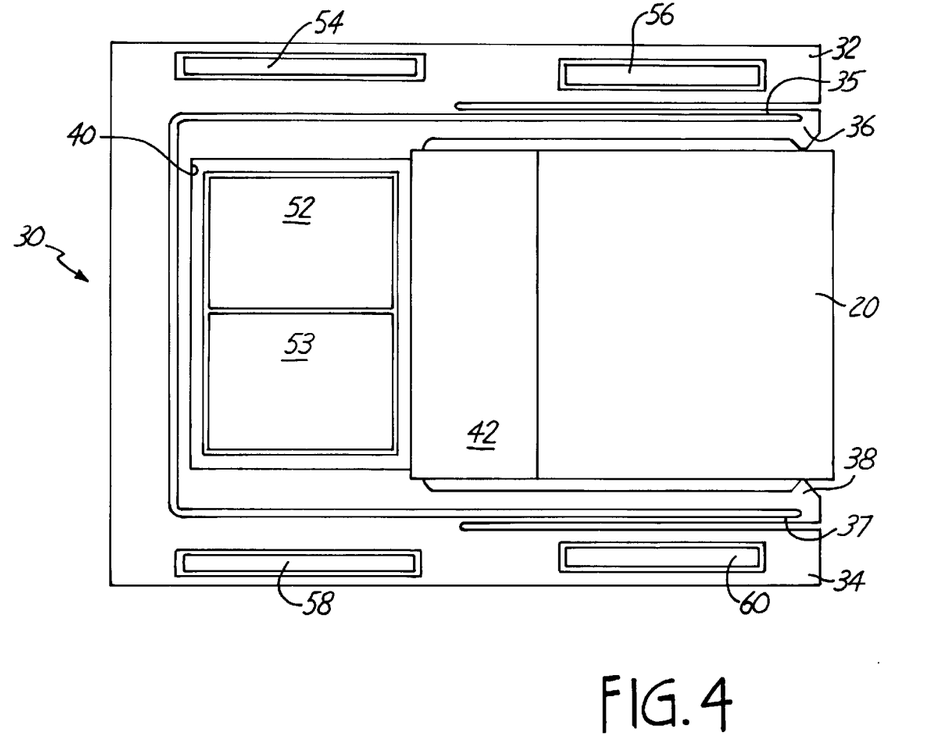
FIG. 4 is a top view of the microactuator system shown in FIG. 3.

FIG. 3 is a perspective view, and FIG. 4 is a top view, of microactuator 30. Microactuator 30 includes outer preloading bars 32 and 34 and inner alignment clips 36 and 38, with inner alignment clips 36 and 38 clamping against the sides of slider 20 at a frontal portion (to the right in FIGS. 3 and 4) thereof. Flexible beam springs 35 and 37 extend between the proximal ends of preloading bars 32 and 34 and the distal ends of alignment clips 36 and 38. A tub 40 having a bottom surface lined with a ferromagnetic keeper material is formed in the substrate of microactuator 30 opposite transducing head 31 of slider 20, and structural bond pad 42 is provided for attachment to the top surface (opposite the air-bearing surface) of slider 20. Magnets 52 and 53 are located in tub 40, attached to the ferromagnetic lining on the bottom surface of tub 40. Standoffs 54, 56, 58 and 60 are formed on respective standoff bases 44, 46, 48 and 50 on outer preloading bars 32 and 34, to be borne upon so as to apply pre-load force to microactuator 30 as it supports slider 20 over the surface of the disc.

Figure 5A:
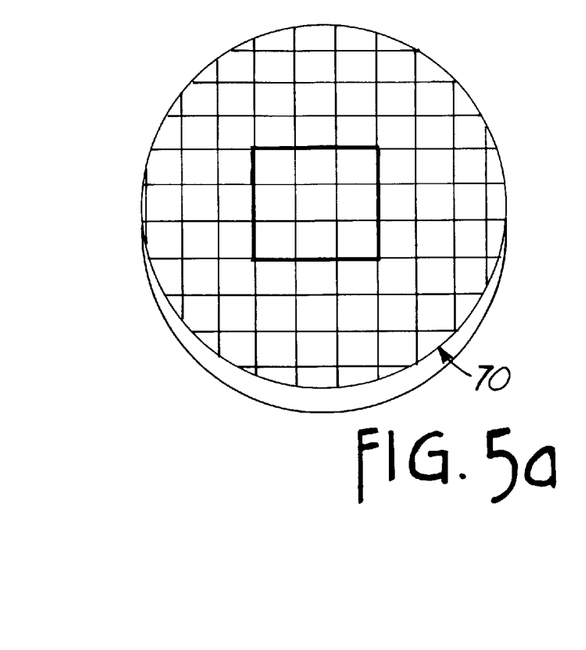
FIG. 5a is a diagram of a typical microactuator substrate wafer.
Figure 5B:
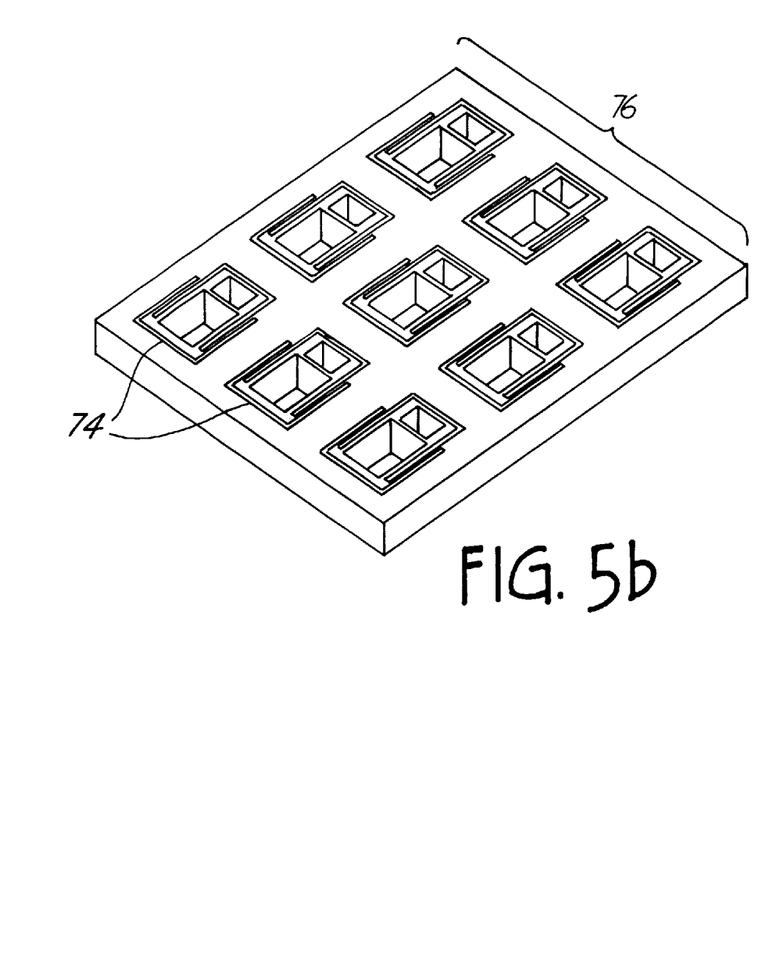

FIG. 5a is a diagram of a typical MEMS substrate wafer 70, and FIG. 5b shows a portion 76 of substrate wafer 70 in an enlarged detailed perspective. Substrate wafer 70 is used to form a plurality of microactuators 74, and has a thickness equal to a desired dimension of the microactuators. The remaining layers of microactuators 74 are then fabricated on wafer 70, producing the devices described above. Portion 76 of substrate wafer 70 shows a 3×3 array of completed microactuators 74.

Figure 6A:
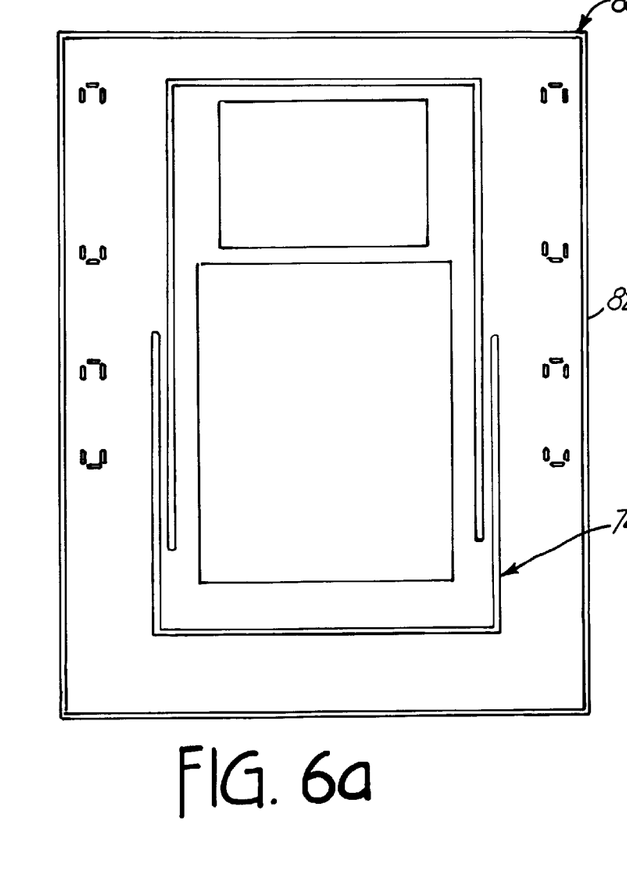
Figure 6B:
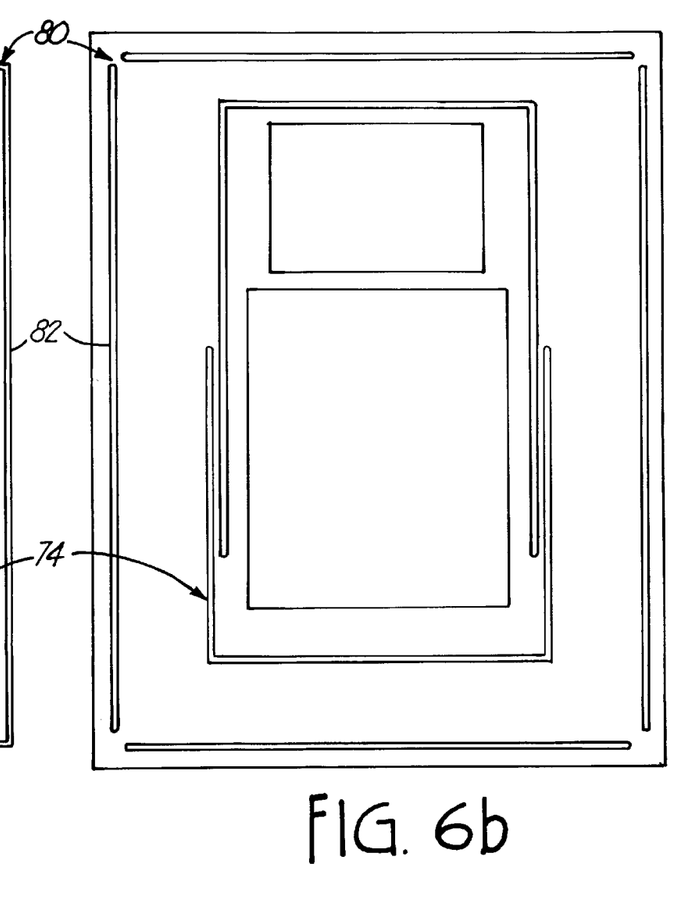
FIG. 6b is a backlit top view of a single microactuator system on a wafer after separating each device according to the present method, showing through etch pattern, with necking at the corners to create tethers.

FIG. 6a is a top-lit top view and FIG. 6b is a backlit top view of single microactuator system 74 after singulation using reactive ion etching (RIE), a process well-known to the art. The etching is performed to form channel 82 of microactuator 74, slightly narrowing the etch at corners 80. A "necked" etch is produced by narrowing the etch feature at corners 80; this induces RIE lag at corners 80. RIE lag is an effect whereby narrow openings etch more slowly than wider openings. Thus, RIE lag prevents the etch from completely permeating (penetrating through) the wafer at narrowed corner 80, so as to produce thin tabs or tethers connecting microactuator 74 to the substrate wafer.

It should be noted that the tabs or tethers need not be restricted to the corners of the device. The tabs can be fabricated at any location around the periphery of the device, as long as the configuration of tabs provides satisfactory support for further device processing steps. Further, it should be noted that the process for forming the tabs or tethers need not be restricted to MEMS devices having a rectangular shape, as shown in FIG. 6b. This process can be adapted for MEMS devices of any shape (e.g., square, circular, etc.) simply by narrowing the periphery etch at the selected tab locations.

Figure 7A:
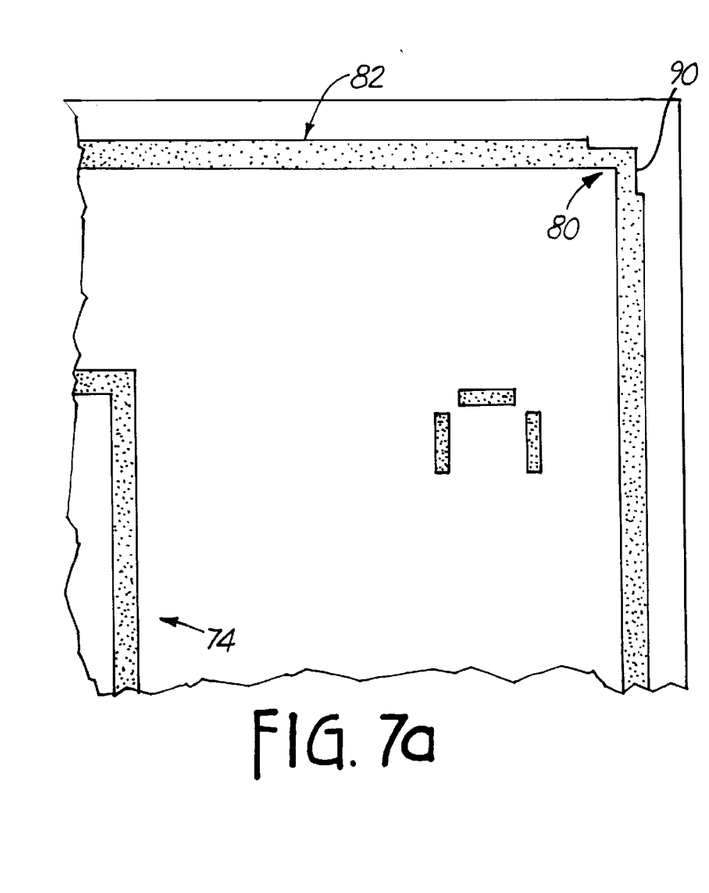
Figure 7B:
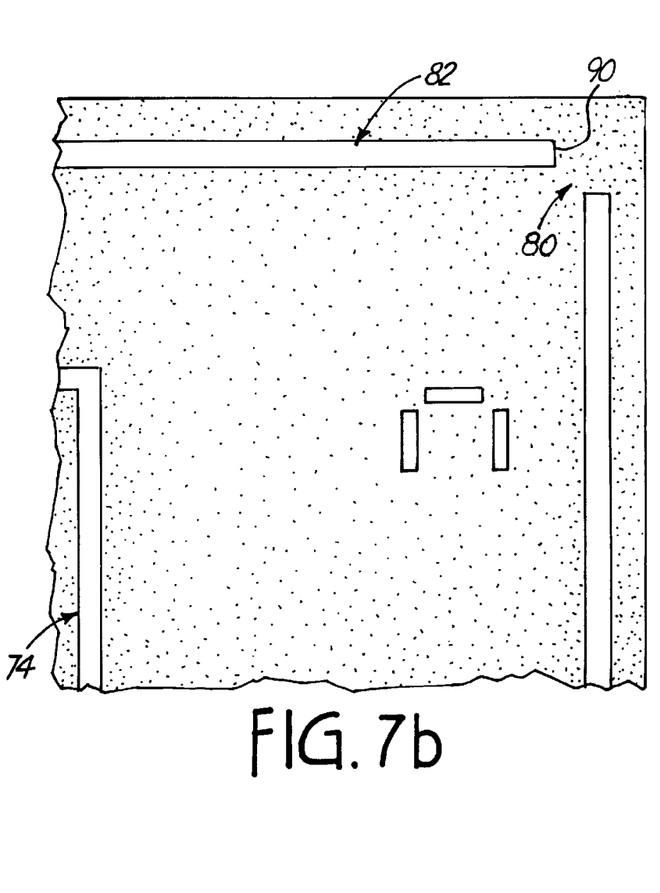
FIG. 7b is a backlit top view of upper right corner of FIG. 6, showing detail of necked periphery etch to form a thin tab at the bottom of the wafer.

FIG. 7a is a top-lit top view and FIG. 7b is a backlit top view of the upper right corner of single microactuator system 74 after singulation using reactive ion etching according to the present invention. Periphery etch channel 82 is narrowed at corner 80 to produce narrowed etch 90.

Narrowing at corner 80 is accomplished by lithographic techniques. After a layer of photoresist is applied to the wafer, a mask is used that exposes a periphery of each microactuator system 74 to ultraviolet light. The mask is shaped such that the periphery channel at each corner of the mask is slightly narrowed. When ultraviolet light is passed through the mask, the photoresist is removed to expose the portion of the wafer to be etched. Next, the wafer is etched using reactive ion etching. RIE is accomplished by placing the wafer on the rf electrode in a planar parallel plate reactor. Here the ions experience a considerable acceleration to the wafer by the dc potential developed between plasma and cathode that results in anisotropic etching. After etching is completed, the wafer is again exposed to ultraviolet light to remove remaining photoresist. This process results in periphery etch channel 82 and narrowed etch channel 90. Because narrow openings etch more slowly than wider openings (because of RIE lag), the etch has not permeated the wafer at corners 80 (FIG. 7b).

Figures 8A, 8B:
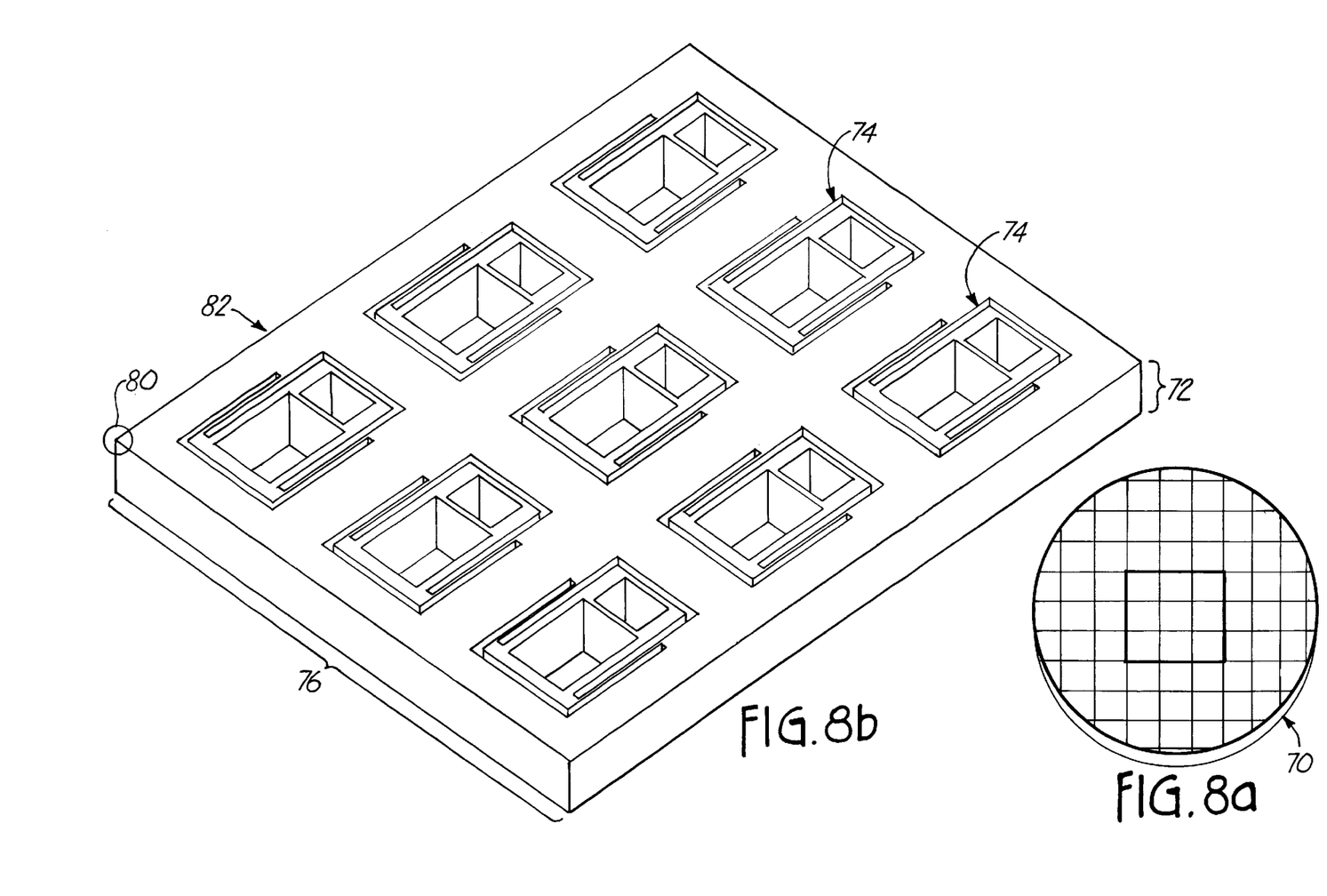

FIG. 8a is a diagram of a typical MEMS substrate wafer 70, and FIG. 8b is a perspective view of portion 76 of wafer 70 after singulation of microactuators 74 using reactive ion etching. Portion 76 of substrate wafer 70 shows a 3×3 array of microactuators 74. Narrowing of periphery etch channel 82 at corners 80 manifests RIE lag, thus preventing etching through wafer 70 at corners 80. As such, the etch nearly permeates wafer 70 of thickness 72 (not to scale, for clarity) at corners 80, thereby fabricating tethers 100 that hold the device on wafer 70 during processing and storage. The small size of tethers 100 allows microactuators 74 to be separated from wafer 70 by a smaller force than that required after conventional singulation methods (e.g., dicing with saw blades). Since removal of devices from wafer 70 requires less force for separation, the risk of damaging microactuators 74 during removal is minimized.

The present invention provides a method by which devices can remain on a silicon wafer after fabrication for processing and storage, yet can easily be removed from the wafer without requiring excessive force that could damage the devices. This is accomplished by utilizing an effect known as RIE lag, a phenomenon that causes narrow openings to etch more slowly than wider openings. When the etch around a periphery of the device is narrowed (necked) at the corners, small tethers are fabricated that hold the device in place. The thickness of the tethers can be controlled to a small fraction of the wafer thickness by adjusting the ratio of the main periphery width to the necked width at the corners. These tethers are rigid enough to hold the device in place until removal is desired. Since the tethers are only a fraction of the width of the silicon wafer, they will reliably break to release the device at a force level that will not damage the part.

Although the present invention has been described with reference to preferred embodiments, workers skilled in the art will recognize that changes may be made in form and detail without departing from the spirit and scope of the invention.

What is claimed is:

1. A method for singulation of microelectromechanical system (MEMS) devices from a substrate wafer, the method comprising:

masking the substrate wafer to define a channel around a periphery of each of the MEMS devices on the substrate wafer, having a first width along a first portion of the channel and having a second width less than the first width along a second portion of the channel; and etching the substrate wafer with a reactive ion etching (RIE) process, so that the MEMS devices are separated from the substrate wafer along the first portion of the channel and breakable tethers are formed connecting the MEMS devices to the substrate wafer along the second portion of the channel.

2. The method of claim 1, wherein a thickness of the breakable tethers is variable by adjusting the ratio of the first width to the second width.

3. The method of claim 1, wherein the devices are disc drive micro actuators.

4. A method of forming a microactuator in a disc drive having a recording disc rotatable about an axis, a slider supporting a transducing head for transducing data with the disc, and an actuation system supporting the slider to position the transducing head adjacent a selected radial track of the disc, the method comprising:

defining a microactuator device area on a substrate wafer;

forming a microactuator frame in the microactuator device area, the microactuator frame including a plurality of flexible beam springs operatively attachable to the slider to permit movement of the slider during operation of the microactuator;

masking the substrate wafer to define a channel around a periphery of the microactuator device area, having a first width along a first portion of the channel and having a second width less than the first width along a second portion of the channel;

etching the substrate wafer with a reactive ion etching (RIE) process, so that the microactuator frame is separated from the substrate wafer along the first portion of the channel and breakable tethers are formed connecting the microactuator frame to the substrate wafer along the second portion of the channel.

5. The method of claim 4, wherein a thickness of the breakable tethers is variable by adjusting the ratio of the first width to the second width.

6. The method of claim 4, wherein the microactuator frame includes a plurality of outer preloading bars and a plurality of inner alignment clips suspended by the flexible beam springs between the outer preloading bars, the flexible beam springs and the inner alignment clips being movable with respect to the outer preloading bars.

* * * * *

UNITED STATES PATENT AND TRADEMARK OFFICE
CERTIFICATE OF CORRECTION

PATENT NO.    : 6,387,778 B1
DATED         : May 14, 2002
INVENTOR(S)   : Wayne A. Bonin et al.

It is certified that error appears in the above-identified patent and that said Letters Patent is hereby corrected as shown below:

Column 2,
Line 52, delete "Slider", insert -- Slider 20 --

Column 5,
Line 23, delete "micro actuators", insert -- microactuators --

Signed and Sealed this

First Day of October, 2002

Attest:

Attesting Officer

JAMES E. ROGAN
Director of the United States Patent and Trademark Office